United States Patent
Sriraman et al.

(10) Patent No.: US 9,966,270 B2
(45) Date of Patent: May 8, 2018

(54) GAS REACTION TRAJECTORY CONTROL THROUGH TUNABLE PLASMA DISSOCIATION FOR WAFER BY-PRODUCT DISTRIBUTION AND ETCH FEATURE PROFILE UNIFORMITY

(71) Applicant: Lam Research Corporation, Fremont, CA (US)

(72) Inventors: Saravanapriyan Sriraman, Fremont, CA (US); Monica Titus, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 14/675,659

(22) Filed: Mar. 31, 2015

(65) Prior Publication Data

US 2016/0293431 A1 Oct. 6, 2016

(51) Int. Cl.
*H01L 21/3065* (2006.01)
*C23C 16/455* (2006.01)
*H01J 37/32* (2006.01)
*H01L 21/31* (2006.01)
*H01L 21/67* (2006.01)

(52) U.S. Cl.
CPC .... *H01L 21/3065* (2013.01); *C23C 16/45561* (2013.01); *C23C 16/45574* (2013.01); *H01J 37/321* (2013.01); *H01J 37/3244* (2013.01); *H01J 37/32449* (2013.01); *H01J 37/32926* (2013.01); *H01L 21/31* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 6,036,878 A | * | 3/2000 | Collins | H01J 37/321 216/68 |
| 6,569,773 B1 | * | 5/2003 | Gellrich | H01L 21/31116 257/E21.252 |
| 2007/0247075 A1 | * | 10/2007 | Kim | H01J 37/321 315/111.21 |
| 2010/0041238 A1 | * | 2/2010 | Cooperberg | C23C 16/45574 438/710 |

* cited by examiner

*Primary Examiner* — Jiong-Ping Lu
(74) *Attorney, Agent, or Firm* — Martine Penilla Group, LLP

(57) ABSTRACT

Methods, systems, and computer programs are presented for controlling gas flow in a semiconductor manufacturing chamber. The method includes flowing a reactant gas thorough an inner feed and a tuning gas through an outer feed surrounding the inner feed, such that the gases do not mix until both are introduced in the chamber. Further, the flow of the reactant gas is convective, and the flow of the tuning gas is directed at an angle from the direction of the reactant gas, providing a delivery of the tuning gas in closer proximity to the RF power before further mixing with the reactant gas. Radio frequency power is provided to the electrode to ignite a plasma using the reactant and tuning gases.

18 Claims, 10 Drawing Sheets

Bottom view

GAS REACTION TRAJECTORY CONTROL THROUGH TUNABLE PLASMA DISSOCIATION FOR WAFER BY-PRODUCT DISTRIBUTION AND ETCH FEATURE PROFILE UNIFORMITY

BACKGROUND

1. Field of the Invention

The present embodiments relates to methods, systems, and programs for controlling processing on the surface of the wafer during a semiconductor manufacturing operation.

2. Description of the Related Art

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

Plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

A potential cause for lack of uniformity is the distribution of gases in the chamber, which may result in varying particle densities across the surface of the wafer, causing different etching rates between the center and the edge of the wafer. Further, another potential cause for lack of uniformity is the uneven distribution of etch by-product in the chamber during operation.

It is in this context that embodiments arise.

SUMMARY

Methods, devices, systems, and computer programs are presented for controlling gas flows of a plurality of gases being introduced in a semiconductor manufacturing chamber. It should be appreciated that the present embodiments can be implemented in numerous ways, such as a method, an apparatus, a system, a device, or a computer program on a computer readable medium. Several embodiments are described below.

In one embodiment, a method for delivering gases to a plasma processing chamber is provided. The plasma processing chamber includes walls, a substrate support, a dielectric window disposed over the substrate support, and a center region of the dielectric window which includes a gas feed injector with an inner feed and an outer feed that surrounds the inner feed. An electrode is disposed over the dielectric window for providing power through the dielectric window to a plasma region that is disposed between the dielectric window and the substrate support configured to support a substrate. The method includes an operation for flowing a reactant gas to the inner feed, the flowing of the reactant gas is set at a convective flow so that the reactant gas has a first flow rate and is directed perpendicular to the substrate. Further, the method includes an operation for flowing a tuning gas to the outer feed, where the flowing of the tuning gas to the outer feed does not mix the tuning gas with the reactant gas until both the reactant gas and the tuning gas are introduced in the plasma region. Further, the flowing of the tuning gas is set at a diffusive flow so that the tuning gas has a second flow rate and is directed at an angle between perpendicular to the substrate and parallel to the dielectric window. The angle provides for delivering the tuning gas in closer proximity to the radio frequency (RF) power before further mixing with the reactant gas. Additionally, the method includes an operation for providing radio frequency (RF) power to the electrode so that a plasma is ignited in the plasma region over the substrate using the reactant gas and the tuning gas. The diffusive flow of the tuning gas is directed at the angle, enabling the tuning gas to be dissociated by the RF power to have mixing and dissociation separated in space and time with the reactant gas. In one configuration, if tuning gas is diffusive then it should take longer time to reach the same distance in comparison to the convective jet of main reactant gas. Further, the introduction, of the reactant gas and the tuning gas into the chamber without pre-mixing, imparts control of etch uniformity across a surface of the substrate during active etching of a material of the substrate. Further yet, etch uniformity is controlled in part by setting either one or both of the reactant gas and tuning gas to include a passivation component. As described in more detail below, in addition to controlling the passivation component, control of etch by-product distribution and control may also be provided.

In another embodiment, a method for delivering gases to a plasma processing chamber is provided. The plasma processing chamber includes walls, a substrate support, a dielectric window disposed over the substrate support, where a center region of the dielectric window includes a gas feed injector that has an inner feed and an outer feed that surrounds the inner feed. An electrode is disposed over the dielectric window for providing power through the dielectric window to a plasma region that is disposed between the dielectric window and the substrate support configured to support a substrate. The method includes operations for flowing a first gas type to the inner feed, and for flowing a second gas type to the outer feed. The second gas type is different than the first gas type, such that the first gas type and the second gas type mix within the plasma region. In addition, the method includes an operation for providing radio frequency (RF) power to the electrode so that a plasma is ignited in the plasma region over the substrate using the first and second gas types. Mixing within the plasma region when the plasma is ignited defines a plasma dissociation pattern between the first and second gas types. The first gas type includes a reactant component, and the second gas includes a tuning component, where the reactant component and the tuning component define the plasma dissociation pattern over the substrate. Introduction of the first gas type and the second gas type into the chamber without pre-mixing imparts control of etch uniformity across a surface of the substrate when the plasma is ignited to cause an etching of a material of the substrate, and etch uniformity is controlled in part by setting either one or both of the first and second gas types to include a passivation component.

In yet another embodiment, a method for delivering gases to a plasma processing chamber is provided. The method includes an operation for setting parameters for a gas box, the parameters defining a first gas flow and a second gas flow. The first gas flow includes one or more first gases, and the second gas flow includes one or more second gases. The first gas flow includes one of reactant gases, or tuning gases, or a mixture of reactant and tuning gases, and the second gas flow includes one of reactant gases, or tuning gases, or a mixture of reactant and tuning gases, where the first gas flow and the second gas flow are independently set by a controller. Additionally, the method includes operations for flowing the first gas flow through an inner feed into the chamber, the inner feed being defined on a center of a top surface of the chamber, and for flowing the second gas flow through an outer feed into the chamber. The outer feed is defined on the top surface of the chamber around the inner feed, where the first gas flow and the second gas flow are not mixed before flowing into the chamber. In addition, the method includes an operation for providing radio frequency (RF) power to an electrode in the chamber to ignite a plasma over the substrate using the first gas flow and the second gas flow. Defining which reactant gases and tuning gases are injected into the chamber, and where the reactant gases and tuning gases are introduced into the chamber, provides for control of dissociation patterns in the chamber to obtain etch uniformity over a surface of the substrate.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

FinFET 3D tri-gate transistors are widely used in today's semiconductor manufacturing. Some of the challenges in etching silicon with selectivity to the fin oxide include zero fin recess, minimal mask loss, straight profiles across the wafer, no 3D-corner residues, and pattern independence across the wafer. In some applications, uniformity across the wafer is compromised due to non-uniform passivation or variations in the passivation. In addition, the high aspect ratio of 3D features may cause excess by-product accumulation, especially after transitioning into the fin etch (2D to 3D etch transition). In some solutions, a high pressure, high-flow $HBr/O_2$ process is used to minimize by-products, but problems still remain regarding non-uniformity of by-product distribution across the wafer.

Embodiments presented herein described methods to control plasma dissociation in the etch chamber to achieve uniform etch profiles across the wafer. Variable gas injection zones, that split or co-join a main reactant gas flow and a corresponding tuning gas flow for the main reactant gas, are defined to control the plasma dissociation over the surface of the wafer.

It will be apparent, that the present embodiments may be practiced without some or all of these specific details. In other instances, well-known process operations have not been described in detail in order not to unnecessarily obscure the present embodiments.

Figure 1:
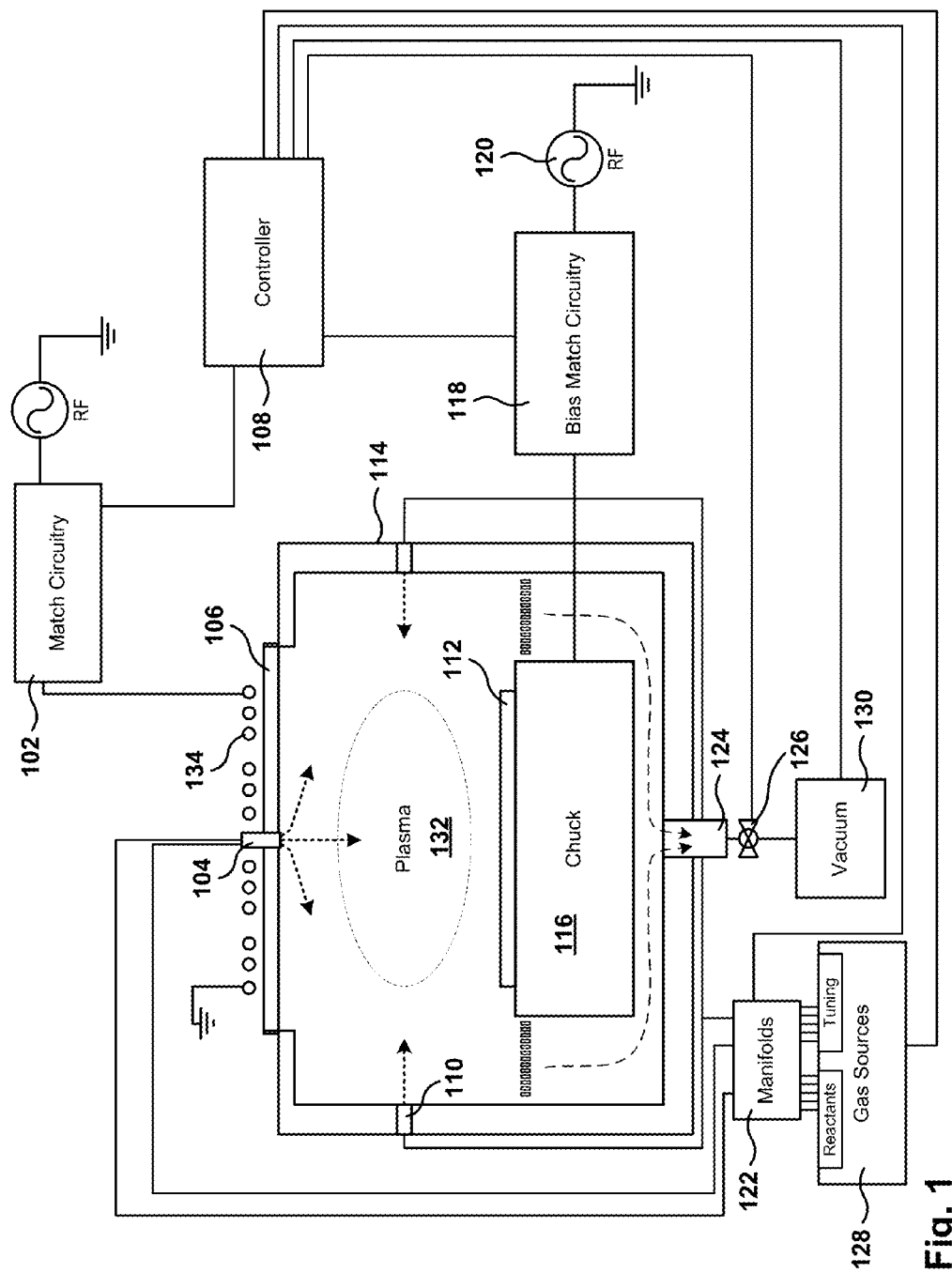
FIG. 1 is a schematic cross-section diagram showing a plasma processing system utilized for etching operations, in accordance with one embodiment of the present invention.

FIG. 1 is a schematic cross-section diagram showing a plasma processing system utilized for etching operations, in accordance with one embodiment. The system includes a chamber 132 that includes a chamber body 114, a chuck 116, and a dielectric window 106. The chuck 116 can be an electrostatic chuck for supporting a substrate 112. In some embodiments, an internal faraday shield (not shown) is disposed inside the chamber 132 beneath the dielectric window 106. A TCP coil 134 is disposed over the dielectric window 106 and is connected to match circuitry 102.

Further shown is a bias RF generator 120, which can be defined from one or more generators. If multiple generators are provided, different frequencies can be used to achieve various tuning characteristics. A bias match 118 is coupled between the RF generators 120 and a conductive plate of the assembly that defines the chuck 116. The chuck 116 also includes electrostatic electrodes to enable the chucking and dechucking of the wafer. Broadly, a filter and a DC clamp power supply can be provided. Other control systems for lifting the wafer off of the chuck 116 can also be provided.

A first gas injector 104 provides two different gas channels to inject two separate streams of process gases to the chamber from the top of the chamber. It should be appreciated that multiple gas supplies may be provided for supplying different gases to the chamber for various types of operations, such as process operations on wafers, waferless autocleaning operations, and other operations. A second gas injector 110 provides another gas stream that enters the chamber through the side instead of from the top.

Gas sources 128 includes a plurality of gas sources that can be mixed through manifolds 122. The gas sources include one or more reactant gases (also referred to herein as main gases) and one or more tuning gases. A reactant gas is an active gas used for etching, and the reactant gas is a source of the species necessary for etching over the substrate. Examples of reactant gases include $Cl_2$, HBr, and $SF_6$, but other reactant gases may also be used.

A tuning gas is a gas used to tune (i.e., control) the on-wafer performance. The tuning gas is used to control the dissociation pattern between gases being injected into the chamber. For example, the tuning gas may be used to change the ratio of ions to neutral etchants. The tuning gas controls the dissociation pattern in the chamber in two ways: first, by controlling dissociation patterns of the gases in the chamber, and second, by controlling the spatial distribution of gas mixtures within the chamber, depending on how the tuning gas is injected into the chamber. Examples of tuning gases include oxygen, helium, argon, and methane, but other tuning gases may also be used.

In the embodiment of FIG. 1, three different independent gas streams are provided into the chamber. The first gas stream is injected through the center of injector 104, and this gas stream is referred to herein as the center stream or the inner stream. The second gas stream is injected also through injector 104 but on a different path that surrounds the center stream, and this second gas stream is referred to as the edge stream or the outer stream. The third gas stream is injected into the side of the chamber via injector 110, and this third gas stream is referred to herein as the side gas stream.

Manifolds 122 control which gases are supplied to each of the three different gas lines. Manifolds 122 allow for any type of gas (reactant or tuning) to be provided to any of the three different gas lines. The gases may be sent without mixing, or be mixed with other gases for feeding the three different independent gas streams.

A vacuum pump 130 is connected to the chamber 132 to enable vacuum pressure control and removal of gaseous byproducts from the chamber during operational plasma processing. A valve 126 is disposed between exhaust 124 and the vacuum pump 130 to control the amount of vacuum suction being applied to the chamber.

The dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 200 Celsius. The temperature will depend on the etching process operation and specific recipe. The chamber 132 will also operate at vacuum conditions in the range of between about 1 m Torr (mT) and about 500 m Torr (mT). Although not all specifically shown, chamber 132 is typically coupled to facilities when installed in a clean room, or a fabrication facility. Facilities include plumbing that provide processing gases, vacuum, temperature control, and environmental particle control.

These facilities are coupled to chamber 132, when installed in the target fabrication facility. Additionally, chamber 132 may be coupled to a transfer chamber that will enable robotics to transfer semiconductor wafers into and out of chamber 132 using typical automation.

A programmable controller 108 is provided for controlling the operation of the chamber 132 and its associated components. Broadly speaking, the controller 108 can be programmed to execute a chamber operation defined by a recipe. A given recipe may specify various parameters for the operation, such as the application of power to the TCP coils, the flow of gas into the chamber, and the application of vacuum. It should be appreciated that the timing, duration, magnitude, or any other adjustable parameter or controllable feature can be defined by a recipe and carried out by the controller to control the operation of the chamber 132 and its associated components. Additionally, a series of recipes may be programmed into the controller 108.

In one embodiment, gas injector 104 provides for optical access into the process chamber, for example, along an axial path from a diagnostic endpoint outside the process chamber through an optical access window. More details for optical access into the chamber may be found in U.S. Pat. No. 7,928,366, entitled "Methods of and Apparatus for Accessing a Process Chamber Using a Dual Zone Gas Injector with Improved Optical Access," and issued on Apr. 19, 2011, which is herein incorporated by reference.

Figure 2:
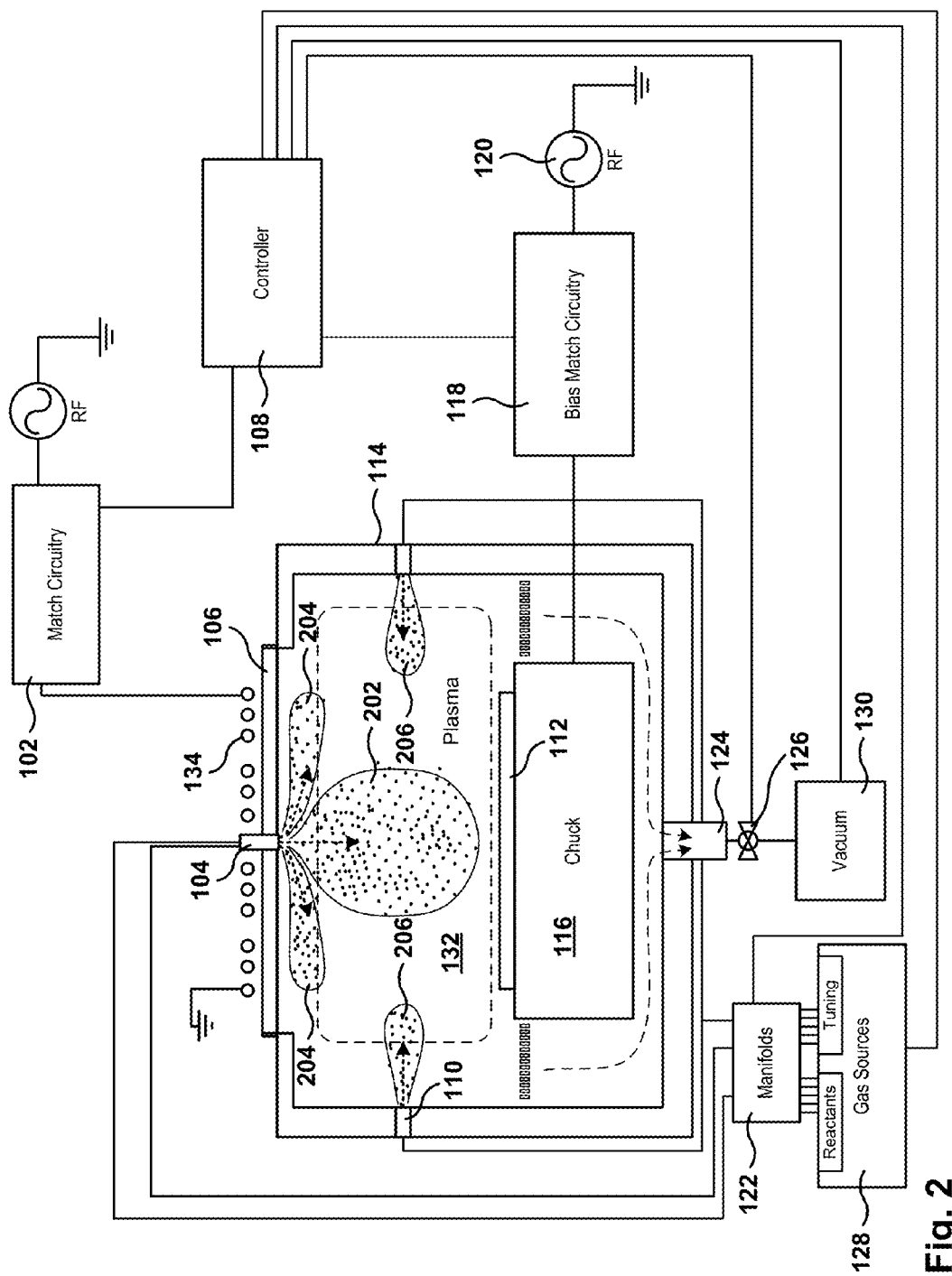
FIG. 2 illustrates the flow of gases into the chamber, according to one embodiment.

FIG. 2 illustrates the flow of gases into the chamber, according to one embodiment. The center gas stream 202 enters the gas chamber 132 through the center injector. In one embodiment, the flow of the center gas stream is mainly convective, aimed towards the center of the wafer.

The edge gas stream 204 enters through a second path in the injector 104, and the side gas stream 206 enters through the side. As discussed in more detail below with reference to FIGS. 3A and 3B, the outer gas stream has an outlet in the injector 104 that surrounds the center outlet. Further, the outlet for the outer gas stream is provided, in one embodiment, at an angle from vertical, i.e., there is an angle greater than zero between the direction of the center gas stream as it enters the chamber and the direction of the outer gas stream when it enters the chamber.

For description purposes, the angle is measured from a direction perpendicular to the substrate, such that a zero angle corresponds to a gas stream coming down from the ceiling of the chamber in a direction perpendicular to the wafer. Therefore, the center gas the stream would have an angle of zero because the direction is perpendicular to the substrate. The edge gas stream has an angle greater than zero, up to 90°. Therefore, at an angle of 45°, the edge gas stream enters the chamber in an angle equidistant between the perpendicular to the substrate and the surface of the dielectric window. An angle of 80° would result in an edge gas stream that would enter the chamber in a direction almost parallel to the dielectric window.

Embodiments presented herein may use any angle between 0° and 90° for the second gas stream. Therefore, in one embodiment the second gas stream could be parallel to the first gas stream.

Manifolds 122 control the gas mixture as well as the flow rate for each of the gas streams. In some solutions, the first and second gas streams do not have separate lines (not shown), and the first and second gas streams contain the same gas mixture, but the controller 108 is able to control the ratio of the flow between the first and second gas streams, an operation which is referred to herein as tuning. For example, 70% flows through the center and 30% flows through the edge stream, although other ratios are also possible (e.g., 80/20, 50/50, 40/60, etc.).

In the embodiment of FIG. 2, there is independent control of the composition of the gas mixtures sent through each line, and the flow ratio for the respective streams.

In one embodiment, the main and tuning gases are split through the center and edge zones, respectively. Alternately, the gas injection for the main reactant can come through any zone in the main injector 104 (or showerhead) and the tuning gases may come from another zone in the same injector or from elsewhere in the chamber (e.g., side injector 110).

Certain processes may be sensitive to dissociation patterns of passivating moieties in the chamber, and by splitting the tuning gas, either a passivation or reactant moiety (e.g., passivating gas such as $O_2$ or other) is generated. The cracking pattern of the gas is changed dramatically due to inherent changes in the plasma dissociation, which provides an additional significant tuning knob for controlling the on-wafer etch performance.

Embodiments presented herein have shown uniform profiles across the wafer, as well as no residues in the 3D corner, without compromising tradeoffs in feature microloading and productivity.

Separating the gases injected into the chamber (e.g., reactant gases and tuning gases) into different streams, and controlling the tuning ratios for flow volumes, enables controlling plasma dissociation patterns that evolve into uniform passivation moiety (and by-products) profile.

In addition, the flow effects from the different injection zones in the nozzle also provide control over the dissociation patterns. In one embodiment, when the main gas flow is convective coming through the center bore of the center injector, the flow through the edge zones is in comparison diffusive. When tuning gases are added to the edge zone separately, the dissociation pattern is different due to the smaller timescales involved in transporting from the edge injection zone into the chamber. If the tuning gas is diffusive, it takes longer for the tuning gas to distribute, depending on the concentration gradient. In one embodiment, the fractional dissociation of the tuning gas is sequenced such that the dissociation happens prior to mixing with the jet that comes from the inner feed zone. The diffusive gas flow from the edge injection zone couples into the ICP power deposition zones directly underneath the windows, in close proximity to the nozzle plane, and the fractional dissociation (and ionization) happens differently than if the gas were fed through the center main injector in a convective fashion.

The reactant gas and the tuning gas can be sent to any of the three streams. Further, gas mixtures with reactant gases or tuning gases may also be injected via any of the three streams. The design engineer has options to control which gases to mix, how to introduce them into the chamber, and at what flow rate. For example, a reactive gas can be fed through the center stream and a tuning gas can be fed through the edge stream. In one embodiment, the tuning gas flow rate is less than the reactant gas flow rate. But in other embodiments, the tuning gas flow rate is not less than the reactant gas flow rate. For example, the reactant gas may be 200 sccm of $Cl_2$ and comes from the inner feed zone, and the tuning gas is He at 200 sccm and comes from the outer feed zone. In this case, the diffusive nature of the outer stream is not just of diffusive in nature as there are local jet effects near the outer feed zone.

The gases come into the chamber and the plasma is then ignited. The dissociation patterns are controlled, based on which gases are used and how the gases are fed. This provides a control over the etching ratios into different parts of the wafer, in order to obtain uniformity of etching across the complete surface of the wafer.

Embodiments presented herein to control the gas flow, allow for the manipulation of the gas flow and the resulting plasma dissociation to gain control over the passivation species distribution flux to the wafer, and the resulting etch by-products that are generated. An optimal neutral-to-ion flux ratio is established resulting in uniform by-product radial profile across wafer, thereby allowing minimal profile loading with respect to pattern dependence (i.e., open area or aspect ratio dependence). The uniformity of by-product distribution is made possible through the modified spatial dissociation of the tuning gas (e.g. $O_2$ or He) for the center and the edge injection zones.

In another embodiment, plasma dissociation tuning can also be effectively managed by tuning gas distribution through the side gas injection port, as well as with a combination of showerhead type main gas injection (as opposed to a nozzle) and secondary local gas injection port near the main gas to affect species dissociation. By separating the reactant and tuning gas streams fed into the chamber, it is possible to control the spatial plasma dissociation profile, resulting in uniform by-product distribution on the wafer.

Therefore, the convection and diffusion of gases may be controlled to affect dissociation patterns. Depending on how the gases are introduced into the chamber, the dissociation rate changes. For example, the more convective the center stream is, the faster the center gases will spread out towards the side of the chamber. The gases from the different streams will mix differently depending on how (e.g., locations and flow rates) the gases are brought into the chamber.

Figure 3A:
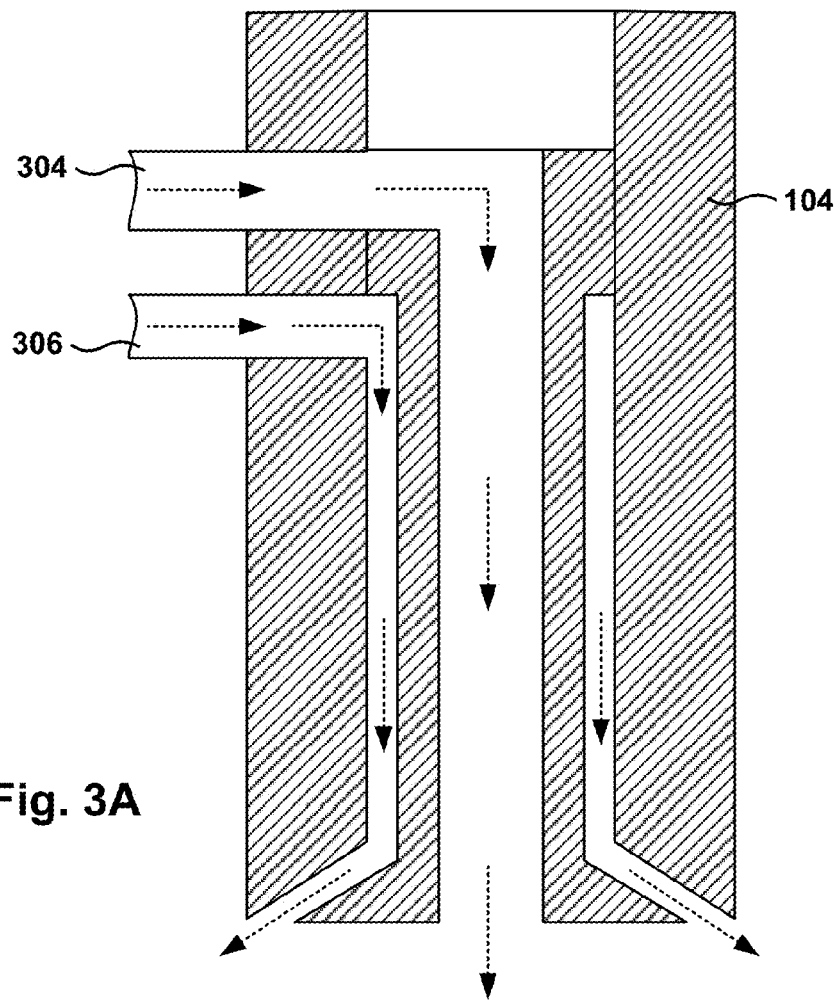
FIG. 3A is a sectional view of the gas injector, according to one embodiment.

FIG. 3A is a sectional view of the gas injector, according to one embodiment. Injector 104 includes two different gas channels: a first gas channel 304 for introducing a first stream into the chamber through the center, and the second gas channel 306 for introducing a second gas stream through the outer channel (i.e., edge channel). Therefore, the reactant in the tuning gases can be mixed separately and introducing the chamber, where the gases combine. The two channels 304 and 306 are independent from each other, and each of the channels may introduce different, or the same, gases. For example, reactant gas chlorine can be brought in through channel 304 and tuning gas helium can be introduced through channel 306.

Separating the gases fed into the chamber, (e.g., reactant gas such as $Cl_2$, HBr, SF6, and tuning gases such as $O_2$, He, $CH_4$) into different streams, and/or allowable tuning ratios, enables the control of selective or preferential plasma dissociation patterns that evolve into a uniform passivation moiety (and by-products) profile. Also this controls the neutral-to-ion flux ratios over the wafer.

In one embodiment, when the main gas flow is convective coming through the center of the injector 104, the flow through the edge zones is in comparison diffusive (e.g., channel 306). When tuning gases are added to the edge zone separately, the dissociation pattern is different due to the modulation in local residence times involved in transport from the edge injection zone into the chamber. The diffusive gas flow from the edge injection zone couples into the ICP power deposition zones directly underneath the windows, and in close proximity to the nozzle plane. The fractional dissociation (and ionization) happens differently than if the gas were fed through main injector in a convective fashion.

The control of the gases and the dissociation partners, which takes into account the flow effects of the center and edge injection zones and the effective plasma dissociation associated with a different flow pattern, results in uniform by-product distribution across the surface of the wafer. This results in uniform FinFET profiles across the wafer with no pattern dependent loading.

It is noted that any type of gas, or gas mixture, can be introduced in any of the streams. Depending on the process, the gases can go introduced through one injector or another. For example, reactant gases (by themselves or within a mixture of gases) may come into the chamber through the center or the edge zones.

In one embodiment, the edge channel has a smaller nozzle than the center channel, and the center channel introduces gas at a higher flow rate than the outer channel. This causes the center channel to be more convective while the edge channel is more diffusive. In another embodiment, the outer channel is defined to introduce gases at a high flow rate, resulting in a convective flow on the outer channel.

Figure 3B:
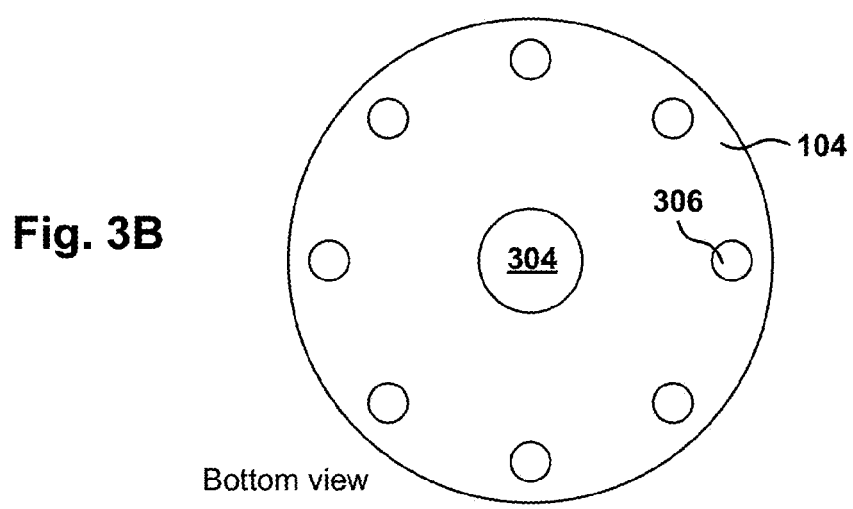
FIG. 3B is a bottom view of the gas injector, according to one embodiment.

FIG. 3B is a bottom view of the gas injector, according to one embodiment. In one embodiment, the outer channel includes eight outlets 306 distributed on the circumference of the base of injector 104. Therefore, the eight outlets are defined over a circle, concentric with the outlet from the center channel, and on that circle, the outlets are separated by a 45° angle as measured from the center of the injector 104.

Other embodiments may include a different number of outlets for the outer channel, such as 2, 4, 16, or any number in a range from 2 to 50. In other embodiments, the outlets may occupy most of the circumference, separated by areas that interconnect the center piece of the injector with the external piece of the injector. In yet another embodiment, the outer channel may define an outer circle that surrounds the center outlet 304.

In one embodiment, the center outlet is bigger than the outer outlets, and the center stream will spread out wider than the outer stream. Thus, the dissociation pattern in the chamber is going to depend on the gases injected through each of the outlets and if the gases are convective or diffusive. In one embodiment, the outer channel is also convective, but in a lesser degree than the center channel.

Figure 4A:
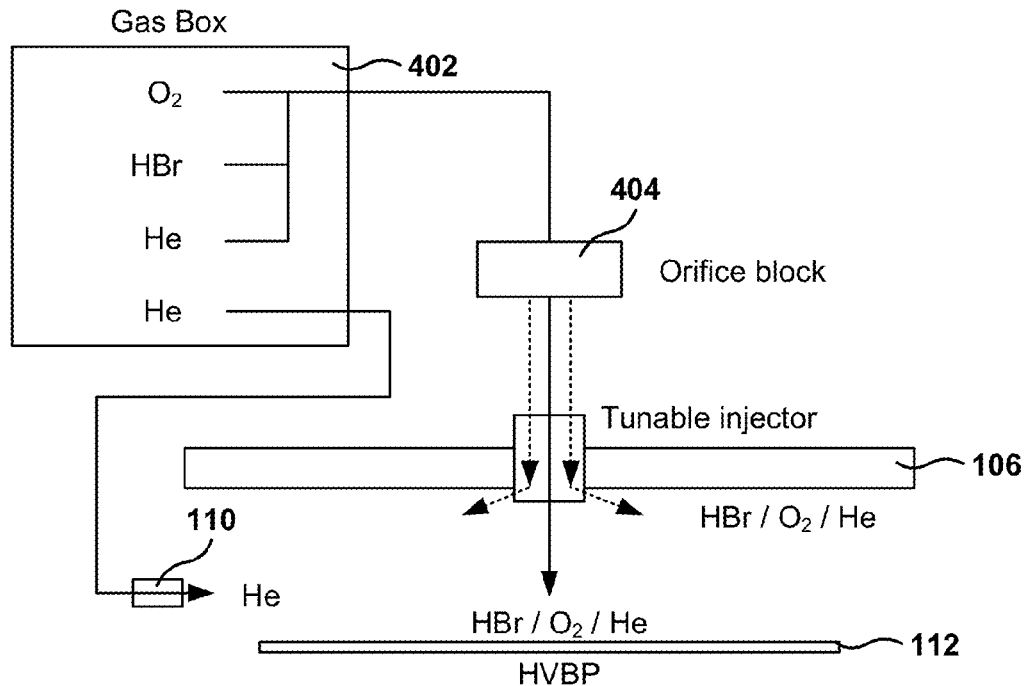
FIG. 4A illustrates the injection of gases into the chamber, according to one embodiment.

FIG. 4A illustrates the injection of gases into the chamber, according to one embodiment. In one embodiment, the chamber includes a gas box 402 with four independent gas supplies: $O_2$, HBr, a first He supply, and a second He supply. The gas box generates a supply of one or more of O2, HBr, and He for the center injector, and He for the side injector 110.

The orifice block controls the relative flow of the mix $O_2$/HBr/He through the center and the outer outlets. The orifice block is tunable to distribute the flow with any ratio. For example, 70% for the center and 30% for the outer stream.

In one embodiment, the flow rates for any of the gas streams is between 100 and 800 SCCMs (Standard Cubic Centimeters per Minute), but other values are also possible. In another embodiment, the flow rates may be between 50 and 2000 SCCMs.

In one embodiment, the chamber is a High Voltage Bias Pulsing (HVBP) chamber, but the same principles presented herein may be used for other types of chambers. For example, the HVBP chamber bias is pulsed at a frequency between 1 Hz and 20 kHz with a duty cycle less than 45%, although other cycles are also possible. In another embodiment, a bias greater than 600 volts is provided through an RF signal with a frequency greater than 2 MHz. The bias is pulsed at a frequency between 1 Hz and 20 kHz with a duty cycle less than 30%. In yet another embodiment, a bias power source for providing a pulsed bias power source for providing a bias greater than 600 volts with a frequency greater than 2 MHz, which is pulsed at a frequency of between 1 Hz and 20 kHz is connected to the plasma processing chamber. For more examples of chambers or operating parameters, reference may be made to commonly owned U.S. patent application Ser. No. 13/252,813, which is herein incorporated by reference.

Figure 4B:
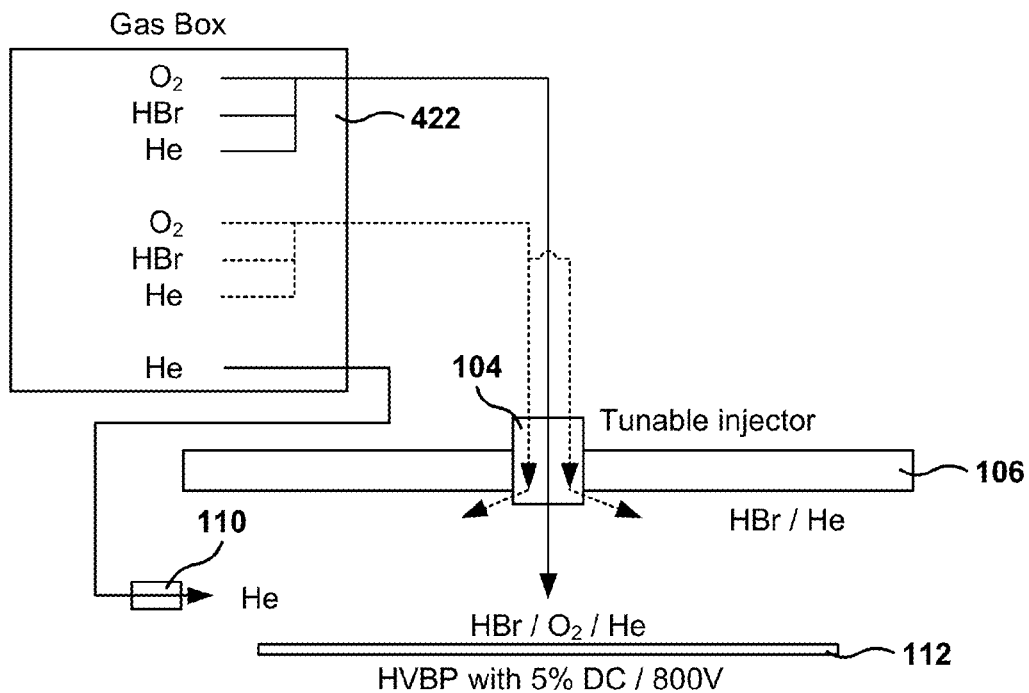
FIG. 4B illustrates the injection of gases with independent gas lines to the inner feed, outer feed, and side feed, according to one embodiment.

FIG. 4B illustrates the injection of gases with independent gas lines to the inner feed, edge feed, and side feed, according to one embodiment. Gas box 422 includes: supplies of $O_2$, HBr, and He for the center stream; supplies of $O_2$, HBr, and He for the edge stream; and a supply of He for the side stream. Therefore, the center stream may include any mixture of one or more gases of $O_2$, HBr, and He for the center stream, as well as the edge stream, but the center stream and the edge stream are independently defined by the controller. In addition, the side stream may include helium or may inject no gas at all.

For example, in one embodiment, the center stream includes a mixture of $50O_2/300HBr/375He$, where the number next to the gas indicates the respective SCCM. The outer stream includes a mixture of 900HBr/1125He, and no gas for the side stream.

Figure 5A:
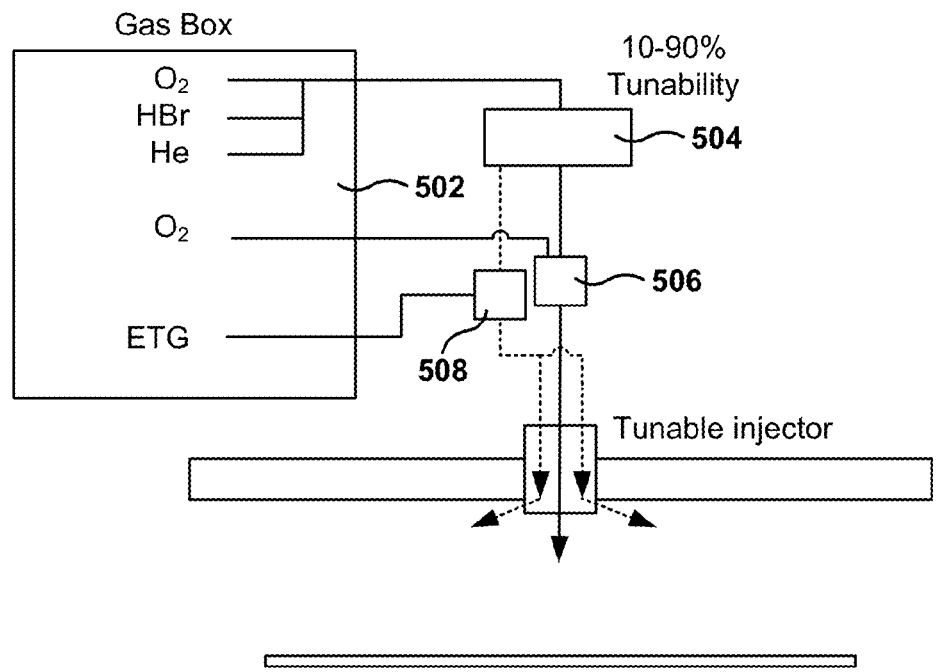
FIGS. 5A and 5B illustrate embodiments of different gas controls for injecting gases into the chamber.
Figure 5B:
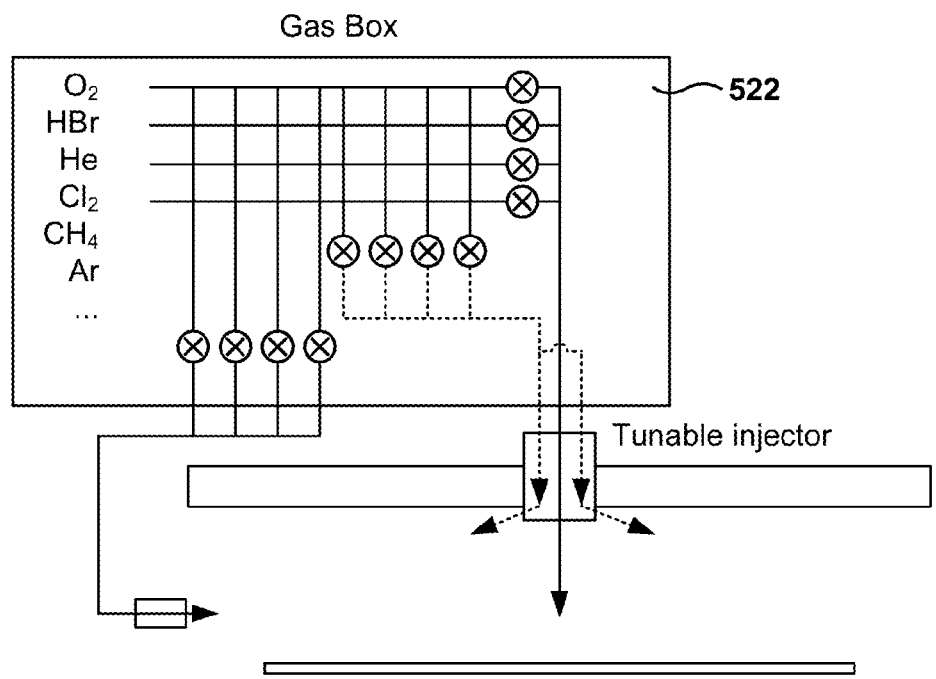

FIGS. 5A and 5B illustrate embodiments of different gas controls for injecting gases into the chamber. FIG. 5A illustrates an embodiment where a first gas mix is provided to the center and outer streams, and then respective boxes allow for the mixture of each stream with another gas.

Gas box 502 provides a mixture of $O_2$, HBr, and He to a tunability box 504, which tunes or distributes the incoming gas mixture towards the center stream and the outer stream. In one embodiment, the tunability ratio is in the range from 10% to 90%, but other values are also possible. For example, 70% of the gas stream may be directed towards the center, and 30% towards the outer stream.

A first mixer 506, mixes the stream coming from tunability box 504 and adds another gas (e.g., oxygen) and the resulting mix is fed through the center stream. The second mixer 508 mixes the second stream coming from tunability box 504 and adds an edge tuning gas (ETG), such as He, and the resulting mix is fed through the edge stream.

FIG. 5B illustrates an embodiment of a gas box 522 provides any combination of gases to any of the streams. In the exemplary embodiment of FIG. 5, only the valves for 4 gases are shown, but other valves may be added for each of the gases. Thus, the center stream is controlled by valves that mix the required gases. The outer and side streams are also control independently by their respective valves.

Some applications may need more ions than other applications. The ionization patterns can be controlled depending on the gases introduced in the chamber, the flow rates for each of the gases, and where the gases are introduced into the chamber. For example, HBr and $Cl_2$ may be the reactant gases, and ions are needed to etch.

If a tuning gas, like He, enters the chamber through the outer stream, the tuning gas is closer to the coil above the dielectric window, affecting the local dissociation patterns. By changing the ratio of the ions and the passivation over the wafer, it is possible to control the uniformity over the entire wafer.

The process engineer identifies the gases to be used and how the gases will be introduced into the chamber, and by having a wide range of options for mixing the gases and how the gases are introduced, the process engineer is able to control the etching ratios in the different areas of the surface of the wafer. For example, if etching is not uniform in a particular application, the process engineer may change the flow of gas through the center stream, or increase the amount of tuning gas provided through the outer stream, or change the gas mixture through any stream.

It is noted that the embodiments illustrated in FIGS. 1-5B are exemplary. Other embodiments may utilize different gases, different gas combinations, different injectors, etc. The embodiments illustrated in FIGS. 1-5B should therefore not be interpreted to be exclusive or limiting, but rather exemplary or illustrative.

Figure 6:
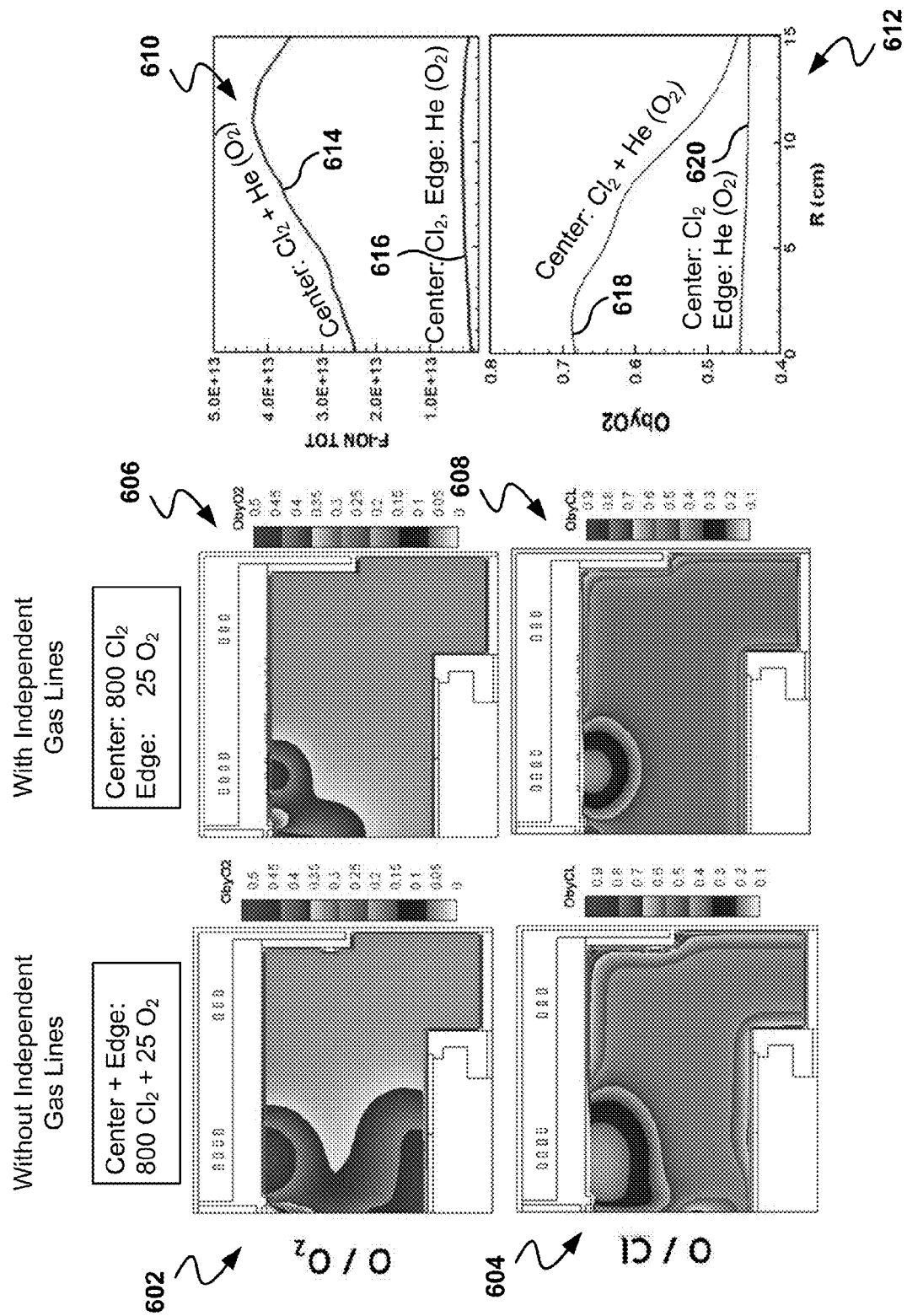
FIG. 6 illustrate testing results showing etching uniformity across the surface of the wafer, according to one embodiment.

FIG. 6 illustrate testing results showing etching uniformity across the surface of the wafer, according to one embodiment. Charts 602 and 606 illustrate the ratio of O concentration to $O_2$ concentration in the chamber, and charts 604 and 608 illustrate the ratio of O to Cl concentrations across the surface of the wafer. Further, chart 602 and 604 relate to a test made without independent gas lines, utilizing $800CL_2$ and $25O_2$ for center and outer streams. Chart 606 and 608 refer to a test performed with independent gas lines, where the center stream includes $800Cl_2$ and the outer stream $25O_2$.

The test results show that, without using independent gas lines, the ratios for the concentration vary along the surface of the wafer. However, when independent gas lines are utilized, the concentrations remain uniform across the complete surface of the wafer. This shows a substantial change in the passivant to etchant ratio.

One explanation, without wishing to be bound by theory, is that there are more byproducts at the edge of the wafer when the same gas feed is utilized, than when separate gas lines are used, where the byproducts are evenly distributed across the surface of the wafer due to the push of the byproducts with the convective stream at the center.

Chart 610 illustrates the total ion flux (vertical axis) across the surface of the wafer (horizontal axis). Line 614 corresponds to the test without independent gas lines, and it shows lack of uniformity over the surface. On the other hand, line 616 corresponds to the test with independent gas lines, and line 616 shows substantial uniformity over the surface of the wafer.

Chart 612 illustrates the ratio of $O/O_2$ concentrations (vertical axis) across the surface of the wafer (horizontal axis). Line 618 corresponds to the test without independent gas lines, and it shows lack of a uniform ratio over the surface. On the other hand, line 620 corresponds to the test with independent gas lines, and line 620 shows a substantially constant ratio of O to $O_2$ over the entire surface of the wafer.

These results show that when using independent gas lines, the total ion flux and the $O/O_2$ ratio are much more uniform than when using the same gases for the center and edge streams.

Figure 7A:
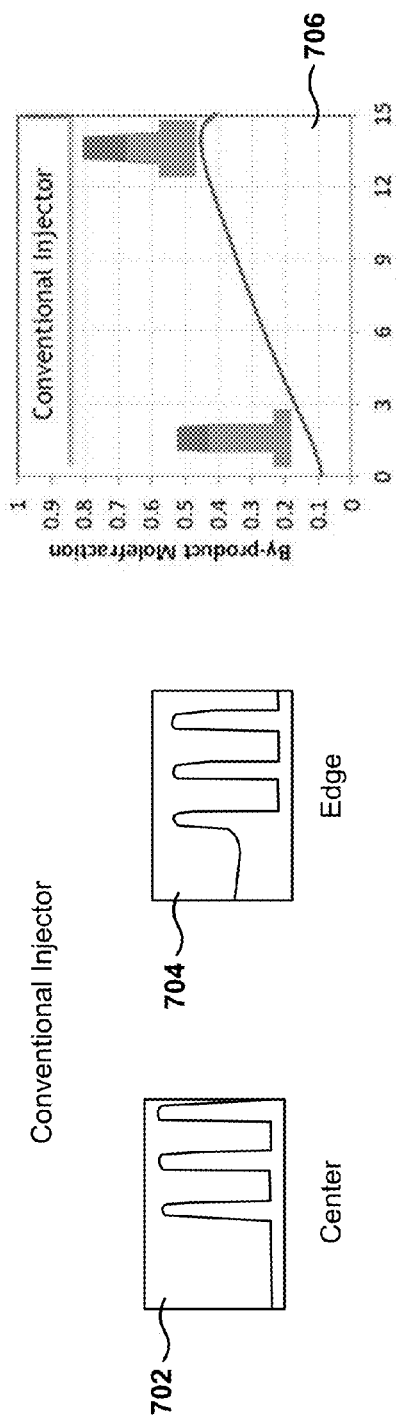
FIGS. 7A and 7B illustrate etching test results for different embodiments.
Figure 7B:
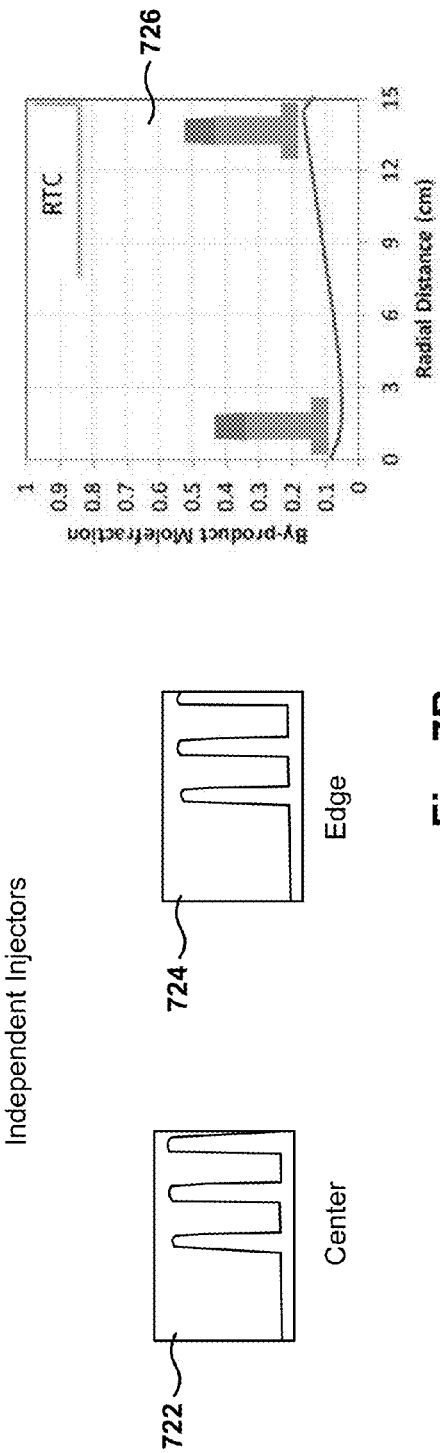

FIGS. 7A and 7B illustrate etching patterns for different embodiments. A first test using a conventional injector (e.g., a single gas mixture) shows how the etching pattern varies from the center 702 to the edge 704, where an open area shows uneven etching. Further, the byproduct molefraction changes dramatically from the center of the wafer (origin of the horizontal axis) to the peripheral area of the wafer.

The second test shows how the etching is substantially uniform, with similar etching patterns at the center 722 and at the edge 724. Further, the byproduct molefraction is also substantially uniform from the center of the wafer to the edge.

Therefore, uniformity can be achieved independently of the percentage of open area of the pattern on the wafer. For example, passivation may be controlled with passivation gasses (e.g., $O_2$), or by adding helium to change the election temperature and the dissociation patterns over the surface of the wafer.

In other cases, the problem may arise at the center instead of at the edge, which means that there is more passivation in the center of the wafer than at the edge of the wafer. The process designer may then increase the convection on the center or control the process condition such that there is more passivation at the wafer edge than the wafer center, etc.

Figure 8:
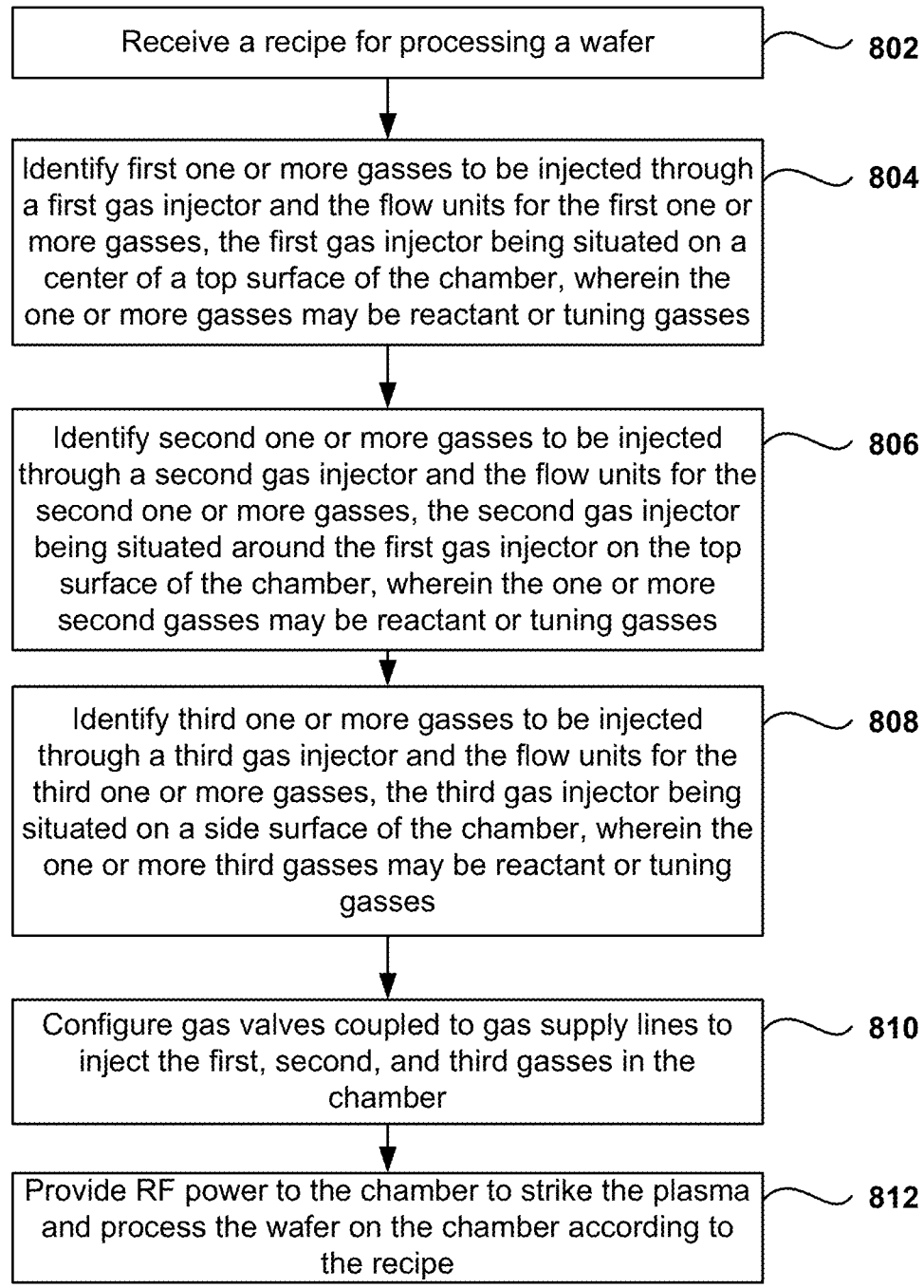
FIG. 8 is a flowchart of an algorithm for processing a wafer in a semiconductor manufacturing chamber, according to one embodiment.

FIG. 8 is a flowchart of an algorithm for processing a wafer in a semiconductor manufacturing chamber, according to one embodiment. While the various operations in this flowchart are presented and described sequentially, one of ordinary skill will appreciate that some or all of the operations may be executed in a different order, be combined or omitted, or be executed in parallel.

In operation 802, a recipe is received by a semiconductor manufacturing equipment for processing a wafer. From operation 802, the method flows to operation 804, where first one or more gasses to be injected through a first gas injector are identified. In addition, the flow units for the first one or more gasses are also identified, the first gas injector being situated on a center of a top surface of the chamber, where the one or more gasses may be reactant or tuning gasses.

In operation 806, second one or more gasses to be injected through a second gas injector are identified, as well as the flow units for the second one or more gasses. The second gas injector is situated around the first gas injector on the top surface of the chamber, where the one or more second gasses may be reactant or tuning gasses.

In operation 808, third one or more gasses to be injected through a third gas injector are identified, as well as the flow units for the third one or more gasses. The third gas injector is situated on a side surface of the chamber, where the one or more third gasses may be reactant or tuning gasses.

From operation 808, the method flows to operation 810 for configuring gas valves coupled to gas supply lines to inject the first, second, and third gasses in the chamber.

From operation 810, the method flows to operation 812 where RF power is provided to the chamber to strike the plasma and process the wafer on the chamber according to the recipe.

Figure 9:
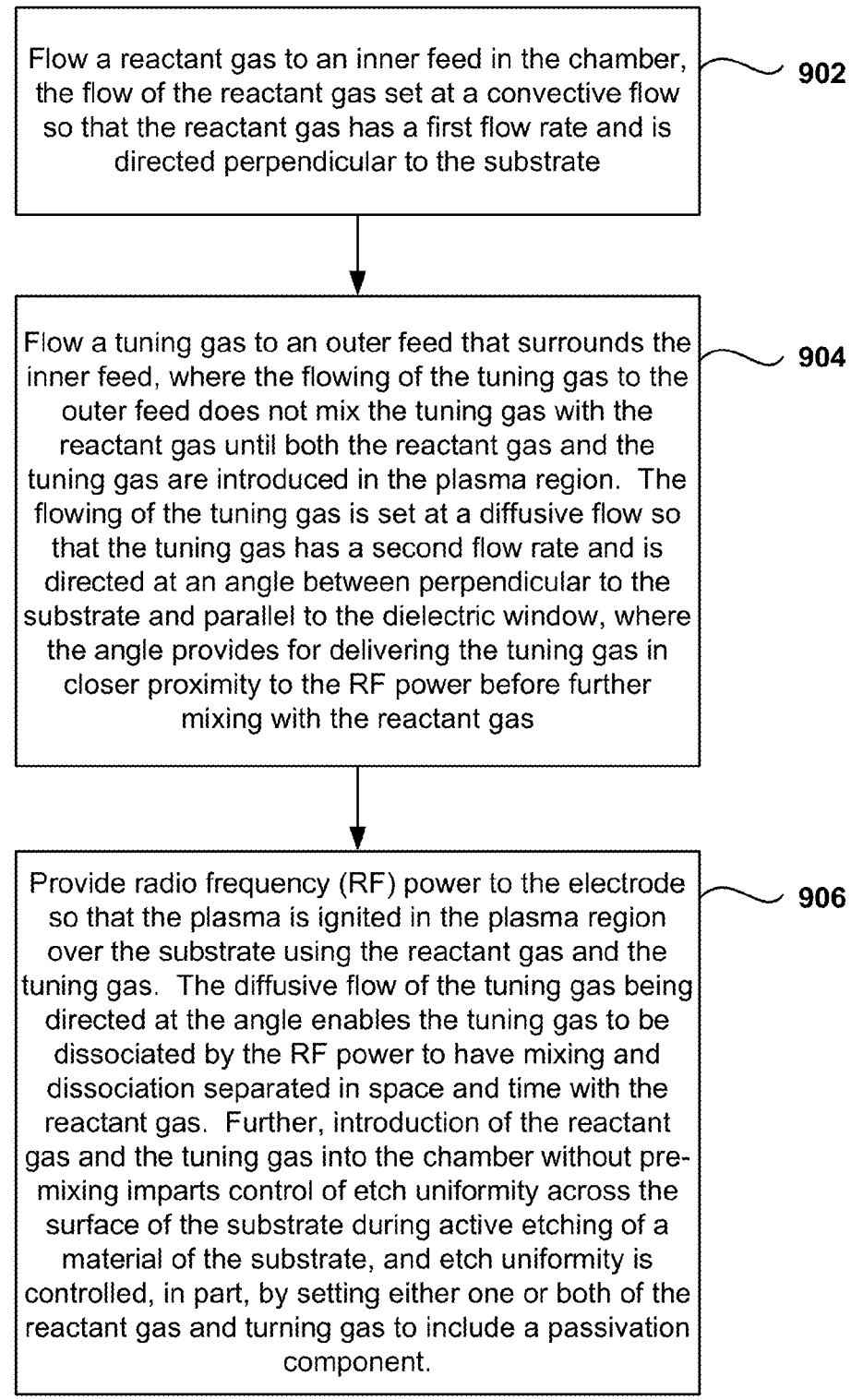
FIG. 9 is a flowchart of an algorithm for controlling gas flows of a plurality of gases being introduced in a semiconductor manufacturing chamber, according to one embodiment.

FIG. 9 is a flowchart of an algorithm for controlling gas flow into the chamber, according to one embodiment. While the various operations in this flowchart are presented and described sequentially, one of ordinary skill will appreciate that some or all of the operations may be executed in a different order, be combined or omitted, or be executed in parallel.

The plasma processing chamber includes walls, a substrate support, a dielectric window disposed over the substrate support. A center region of the dielectric window includes a gas feed injector that has an inner feed and an outer feed that surrounds the inner feed, and an electrode is disposed over the dielectric window for providing power through the dielectric window to a plasma region that is disposed between the dielectric window and the substrate support configured to support a substrate.

Operation 902 is for flowing a reactant gas to the inner feed, the flowing of the reactant gas is set at a convective flow so that the reactant gas has a first flow rate and is directed perpendicular to the substrate. As used herein, convection is the concerted, collective movement of groups or aggregates of molecules within fluids (e.g., liquids, gases) due to the fluid's bulk motion. Thus, the convective motion of a gas is the result of imparting motion on the particles of the gas, such as a gas being transported with high pressure through a pipe into the chamber. When the gas enters the chamber, the gas has convective motion due to the inertia of the gas particles that are being carried through the gas pipe.

From operation 902, the method flows to operation 904 for flowing a tuning gas to the outer feed. The flowing of the tuning gas to the outer feed does not mix the tuning gas with the reactant gas until both the reactant gas and the tuning gas are introduced in the plasma region, and the flowing of the tuning gas is set at a diffusive flow so that the tuning gas has a second flow rate and is directed at an angle between perpendicular to the substrate and parallel to the dielectric window. The angle provides for delivering the tuning gas in closer proximity to the RF power before further mixing with the reactant gas.

Diffusion is the net movement of a substance (e.g., an atom, ion or molecule) from a region of high concentration to a region of low concentration. A distinguishing feature of diffusion is that it results in mixing or mass transport, without requiring bulk motion (bulk flow). Diffusion should not be confused with convection or advection, which are other transport phenomena that utilize bulk motion to move particles from one place to another. Thus, in general, a gas in a convective stream will spread throughout the chamber faster than the same gas in a diffusive stream due to the bulk flow of the convective stream that impinges motion on the corresponding particles.

From operation 904, the method flows to operation 906 for providing radio frequency (RF) power to the electrode so that a plasma is ignited in the plasma region over the substrate using the reactant gas and the tuning gas. The diffusive flow of the tuning gas, being directed at the angle, enables the tuning gas to be dissociated by the RF power to have mixing and dissociation separated in space and time with the reactant gas. In addition, the introduction of the reactant gas and the tuning gas into the chamber, without pre-mixing, imparts control of etch uniformity across a surface of the substrate during active etching of a material of the substrate. Further, etch uniformity is controlled in part by setting either one or both of the reactant gas and tuning gas to include a passivation component.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
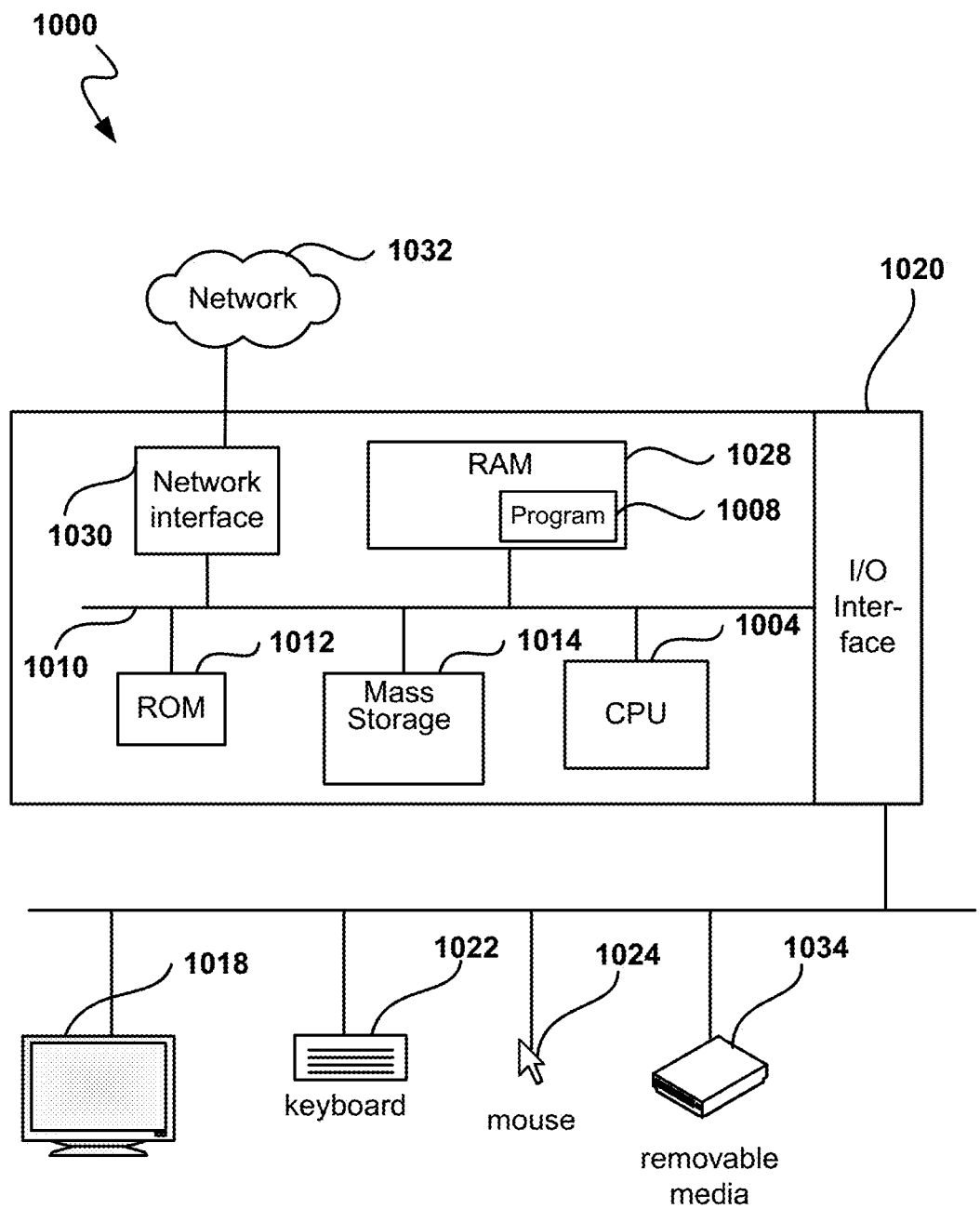
FIG. 10 is a simplified schematic diagram of a computer system for implementing embodiments of the present invention.

FIG. 10 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 1004, which is coupled through bus 1010 to random access memory (RAM) 1006, read-only memory (ROM) 1012, and mass storage device 1014. System controller program 1008 resides in random access memory (RAM) 1006, but can also reside in mass storage 1014.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1006, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for delivering gases to a plasma processing chamber, comprising:
    the plasma processing chamber including walls, a substrate support, a dielectric window disposed over the substrate support, a center region of the dielectric window includes a gas feed injector that has an inner feed and an outer feed that surrounds the inner feed, an electrode is disposed over the dielectric window for providing power through the dielectric window and to a plasma region that is disposed between the dielectric window and the substrate support configured to support a substrate;
    flowing separately a reactant gas to the inner feed, the flowing of the reactant gas is set at a convective flow so that the reactant gas has a first flow rate and is directed perpendicular to the substrate;
    flowing separately a tuning gas to the outer feed, the tuning gas having a different chemical composition than the reactant gas, the flowing of the tuning gas to the outer feed is not mixed with the reactant gas until both the reactant gas and the tuning gas are introduced in the plasma region, the flowing of the tuning gas is set at a diffusive flow so that the tuning gas has a second flow rate that is less than the first flow rate, and is directed at an angle that is away from the reactant gas between perpendicular to the substrate and parallel to the dielectric window; and
    providing radio frequency (RF) power to the electrode so that a plasma is ignited in the plasma region over the substrate using the reactant gas and the tuning gas, the angle at which the tuning gas is introduced into the plasma region is such that at least a fraction of the tuning gas that is closer to the dielectric window is exposed to the RF power provided through the dielectric window before mixing with the reactant gas;
    wherein the diffusive flow of the tuning gas enables the fraction of the tuning gas to be dissociated by the RF power and a fraction to not be dissociated before being mixed with the reactant gas and ignited to form the plasma in the plasma region;
    wherein introduction of the reactant gas and the tuning gas separately via independent gas lines into the chamber without pre-mixing imparts control of etch uniformity across a surface of the substrate during active etching of a material of the substrate, the etch uniformity is a result of control of spatial plasma dissociation profiles by said separate flows of reactant gas and tuning gas;
    wherein etch uniformity is controlled in part by setting either one or both of the reactant gas and tuning gas to include a passivation component.

2. The method as recited in claim 1, wherein the tuning gas is a gas used to manage etching performance on the surface of the substrate, the tuning gas used to control the dissociation pattern of reactants gases being injected into the chamber, wherein the tuning gas is one of a passivation or a reactant moiety.

3. The method as recited in claim 1, further including:
    flowing a side gas through a side feed at a side of the chamber, the side gas being another tuning gas.

4. The method as recited in claim 1, further including:
    tuning a ratio between a volume flow of the reactant gas and a volume flow of the tuning gas.

5. The method as recited in claim 1, wherein the diffusive gas flow from the tuning gas couples into deposition zones directly underneath the dielectric window in close proximity to the outer feed.

6. The method as recited in claim 1, wherein the outer feed includes a plurality of holes defined on a circle concentric with the inner feed.

7. The method as recited in claim 1, wherein a dissociation rate in the chamber is controlled by adjusting the convective flow and the diffusive flow.

8. The method as recited in claim 1, wherein operations of the method are performed by a computer program when executed by one or more processors, the computer program being embedded in a non-transitory computer-readable storage medium.

9. A method for delivering gases to a plasma processing chamber, comprising:
the plasma processing chamber including walls, a substrate support, a dielectric window disposed over the substrate support, a center region of the dielectric window includes a gas feed injector that has an inner feed and an outer feed that surrounds the inner feed, an electrode is disposed over the dielectric window for providing power through the dielectric window and to a plasma region that is disposed between the dielectric window and the substrate support configured to support a substrate;
flowing separately a first gas type to the inner feed;
flowing separately a second gas type to the outer feed, the second gas type having a different chemical composition than the first gas type, such that the first gas type and the second gas type are not mixed before being introduced into the plasma region; and
providing radio frequency (RF) power to the electrode so that a plasma is ignited in the plasma region over the substrate using the first and second gas types, wherein mixing within the plasma region when the plasma is ignited defines a plasma dissociation pattern between the first and second gas types;
wherein the second gas is introduced at an angle that is away from the first gas, and the first gas has a first flow rate that is higher than a second flow rate of the second gas, such that a fraction of the second gas is configured to dissociate by the RF power being provided through the dielectric window, said RF power being in closer proximity to the second gas due to said second gas being introduced at the angle, the fraction of said second gas that is dissociated is then mixed with the first gas to ignite the plasma in the plasma region;
wherein the first gas type includes a reactant component;
wherein the second gas includes a tuning component;
wherein the reactant component and the tuning component define the plasma dissociation pattern over the substrate, wherein introduction of the first gas type and the second gas type is via independent gas lines into the chamber without pre-mixing the first gas type and second gas type to impart control of etch uniformity across a surface of the substrate when the plasma is ignited to cause an etching of a material of the substrate, the etch uniformity is a result of control of spatial plasma dissociation profiles by said separate flows that deliver said reactant component and said tuning component;
wherein etch uniformity is controlled in part by setting either one or both of the first and second gas types to include a passivation component.

10. The method as recited in claim 9, wherein the reactant component of the first gas type is a source of species for etching the substrate.

11. The method as recited in claim 9, wherein the first gas is selected from a group consisting of chlorine, or hydrogen bromide, or sulfur hexafluoride.

12. The method as recited in claim 9, wherein the second gas is selected from a group consisting of oxygen, or helium, or argon, or methane, or carbon dioxide.

13. A method for processing a substrate in a chamber, the method comprising:
setting parameters for a gas box, the parameters defining a first gas flow and a second gas flow, the first gas flow including one or more first gases, and the second gas flow including one or more second gases, wherein the first gas flow includes one of reactant gases, or tuning gases, or a mixture of reactant and tuning gases, wherein the second gas flow includes one of reactant gases, or tuning gases, or a mixture of reactant and tuning gases, wherein the first gas flow and the second gas flow are independently set by a controller;
flowing separately the first gas flow through an inner feed into the chamber, the inner feed being defined at a center of a dielectric window of the chamber;
flowing separately the second gas flow through an outer feed into the chamber, the outer feed surrounding the inner feed at the center of the dielectric window, wherein the first gas flow and the second gas flow are each separately introduced into the chamber via independent gas lines so that the first gas flow and the second gas flow are of different chemical compositions and are not mixed before flowing into the chamber; and
providing radio frequency (RF) power to an electrode disposed over the dielectric window to ignite a plasma over the substrate using the first gas flow and the second gas flow;
wherein the second gas flow is introduced at an angle that is away from the first gas flow, the first gas flow having a first flow rate that is higher than a second flow rate of the second gas flow, such that said second gases of the second gas flow are configured to at least partially dissociate by the RF power being provided through the dielectric window and said second gas flow being introduced at the angel that places a fraction of the second gas flow in closer proximity to the dielectric window, the fraction dissociated second gases of the second gas flow then mix with the first gases of the first gas flow to ignite the plasma over the substrate;
wherein defining which reactant gases and tuning gases are injected into the chamber and where the reactant gases and tuning gases are introduced into the chamber provides for control of dissociation patterns and control of spatial plasma dissociation profiles in the chamber to obtain etch uniformity over a surface of the substrate.

14. The method as recited in claim 13, wherein the first gas flow includes at least one reactant gas and the second gas flow includes at least one tuning gas.

15. The method as recited in claim 13, wherein the first gas flow includes hydrogen bromide, oxygen, and helium, and the second gas flow includes hydrogen bromide and helium.

16. The method as recited in claim 13, wherein the tuning gas is a gas used to manage etching performance on the surface of the substrate, the tuning gas used to control the dissociation pattern of reactants gases being injected into the chamber, wherein the tuning gas is one of a passivation or a reactant moiety.

17. The method as recited in claim 13, wherein the inner feed injects the first gas flow into the chamber in a first direction that is vertical and the outer feed injects the second gas flow at the angle.

18. The method as recited in claim 13, wherein setting parameters for the gas box further includes setting flow speeds for the first gas flow and the second gas flow.

* * * * *